United States Patent
Kim et al.

(10) Patent No.: US 9,153,307 B2
(45) Date of Patent: Oct. 6, 2015

(54) SYSTEM AND METHOD TO PROVIDE A REFERENCE CELL

(71) Applicant: QUALCOMM Incorporated, San Diego, CA (US)

(72) Inventors: Taehyun Kim, San Diego, CA (US); Jung Pill Kim, San Diego, CA (US); Sungryul Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/021,674

(22) Filed: Sep. 9, 2013

(65) Prior Publication Data

US 2015/0070978 A1    Mar. 12, 2015

(51) Int. Cl.
*G11C 11/16* (2006.01)
*G11C 7/06* (2006.01)
*G11C 7/14* (2006.01)
*G11C 13/00* (2006.01)

(52) U.S. Cl.
CPC ............ *G11C 11/1673* (2013.01); *G11C 7/062* (2013.01); *G11C 7/14* (2013.01); *G11C 11/1659* (2013.01); *G11C 13/0069* (2013.01)

(58) Field of Classification Search
CPC .................................................. G11C 13/0069
USPC .......................................... 365/158, 148, 201
See application file for complete search history.

(56) References Cited

U.S. PATENT DOCUMENTS

| 7,167,389 | B2 | 1/2007 | Iwata |
| 7,499,314 | B2 | 3/2009 | Yang et al. |
| 7,813,166 | B2 | 10/2010 | Jung et al. |
| 8,009,467 | B2 | 8/2011 | Nebashi et al. |
| 8,098,513 | B2 | 1/2012 | Liu et al. |
| 8,274,819 | B2 | 9/2012 | Yang |
| 8,406,072 | B2 | 3/2013 | Kim et al. |
| 8,446,753 | B2 | 5/2013 | Kim et al. |
| 2005/0099855 | A1* | 5/2005 | Holden et al. ................ 365/200 |
| 2007/0247939 | A1 | 10/2007 | Nahas et al. |
| 2009/0201717 | A1* | 8/2009 | Maeda et al. ................ 365/148 |
| 2011/0157971 | A1 | 6/2011 | Kim et al. |
| 2011/0194333 | A1* | 8/2011 | Kim et al. .................... 365/158 |
| 2012/0075906 | A1 | 3/2012 | Ho et al. |
| 2013/0016553 | A1 | 1/2013 | Rao et al. |

OTHER PUBLICATIONS

Partial International Search Report—PCT/US2014/054082—ISA/EPO—Nov. 10, 2014, 6 pages.
International Search Report and Written Opinion for International Application No. PCT/US2014/054082, ISA/EPO, Date of Mailing Jan. 20, 2015, 16 pages.

* cited by examiner

*Primary Examiner* — Shawki S Ismail
*Assistant Examiner* — Muhammad Islam
(74) *Attorney, Agent, or Firm* — Toler Law Group, PC

(57) ABSTRACT

An apparatus includes a group of data cells and a reference cell coupled to the group of data cells. The reference cell includes four magnetic tunnel junction (MTJ) cells. Each of the four MTJ cells is coupled to a distinct word line. Each of the four MTJ cells includes an MTJ element and a single transistor. The single transistor of each particular MTJ cell is configured to enable read access to the MTJ element of the particular MTJ cell.

31 Claims, 9 Drawing Sheets

SYSTEM AND METHOD TO PROVIDE A REFERENCE CELL

I. FIELD

The present disclosure is generally related to a reference cell.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Many portable personal computing devices also include memory devices, such as magnetoresistive random-access memory (MRAM) devices, that enable storage of data. A MRAM device is a memory device that stores data using a plurality of magnetic storage elements. An example of a magnetic storage element is a magnetic tunnel junction (MTJ) element. A spin transfer torque (STT) MTJ element may store data by using a current to align an orientation of a magnetic moment of a free magnetic layer of the MTJ element relative to a fixed magnetic layer of the MTJ element. For example, when the free magnetic layer has the same orientation as the fixed magnetic layer, the MTJ element may be in a parallel state and may have a first resistance value (Rp). The first resistance value may represent a particular logic state (e.g., logic 0). When the free magnetic layer has a different orientation from the fixed magnetic layer, the MTJ element may be in an anti-parallel state and may have a second resistance value (Rap). The second resistance value may represent another particular logic state (e.g., logic 1). When the MTJ element is read, the first resistance value may correspond to a first voltage value that indicates the particular logic state, and the second resistance value may correspond to a second voltage value that indicates the other logic state.

To read a logic state stored in an MRAM, a particular MTJ element of the MRAM may be selected via a bit line, and a current may be generated to pass through the particular MTJ element. The current that passes through the particular MTJ element may be compared to a reference current using a sense amplifier circuit to determine the stored logic state. Alternatively, the current may be converted to a voltage, and the voltage may be compared to a reference voltage to determine the stored logic state.

A reference circuit may provide a resistance value. A reference current and/or a reference voltage may be determined based on the resistance value. For example, the reference circuit may include a first reference MTJ element and a second reference MTJ element. The first reference MTJ element may have a first resistance value corresponding to a first logic state (e.g., logic 0), and the second reference MTJ element may have a second resistance value corresponding to a second logic state (e.g., logic 1). The resistance value may be generated by the reference circuit using the first reference MTJ element and the second reference MTJ element. However, an effective resistance value of an MTJ element may vary from one MTJ element to another due to manufacturing variations and defects. Such variation may reduce a read sensing margin that may lead to overall die yield loss.

III. SUMMARY

Systems and methods of providing a reference cell are disclosed. The reference cell may provide a resistance value using multiple magnetic tunnel junction (MTJ) elements. Using a greater number of reference MTJ elements to generate a resistance value may reduce the effect of resistance value variations of individual reference MTJ elements on the resistance value.

For example, a memory array may include a plurality of columns of MTJ cells. Each MTJ cell may be implemented using a single MTJ element and a single transistor. A particular column of MTJ cells may be coupled to a particular bit line. A particular row of MTJ cells may be connected to a particular word line. The particular bit line and the particular word line may be used to select a particular MTJ cell at the particular row of the particular column of MTJ cells. An MTJ cell may correspond to a data cell. The data cell may be used to store a logic state (e.g., logic 0 or logic 1).

A multiple MTJ cells may be used as a reference cell (e.g., a reference circuit that provides a resistance value). For example, the reference cell may include four MTJ cells. A single transistor of a particular MTJ cell of the reference cell may be configured to enable read access to the single MTJ element of the particular MTJ cell. The four MTJ cells may be interconnected so that the reference cell is coupled to a common bit line. Each of the four MTJ cells may be coupled to a distinct word line.

The reference cell may be activated to generate a resistance value. In a particular embodiment, a reference voltage may be determined according to a resistance-mean reference scheme based on the resistance value. In another embodiment, the reference voltage may be determined according to a current-mean reference scheme based on the resistance value.

In a particular embodiment, an apparatus includes a group of data cells and a reference cell coupled to the group of data cells. The reference cell includes four magnetic tunnel junction (MTJ) cells. Each of the four MTJ cells is coupled to a distinct word line. Each of the four MTJ cells includes an MTJ element and a single transistor. The single transistor of each particular MTJ cell is configured to enable read access to the MTJ element of the particular MTJ cell.

In another particular embodiment, a method includes activating a reference cell of a first memory array via four word lines. The reference cell may include four magnetic tunnel junction (MTJ) cells. The method also includes generating a reference current through a first bit line coupled to the reference cell, where the four MTJ cells are coupled to the first bit line.

One particular advantage provided by at least one of the disclosed embodiments is an ability to provide a resistance value from a reference cell that reduces the effect of resistance value variations of individual reference MTJ elements on the resistance value.

Other aspects, advantages, and features of the present disclosure will become apparent after review of the entire appli-

IV. BRIEF DESCRIPTION OF THE DRAWINGS

V. DETAILED DESCRIPTION

Figure 1:
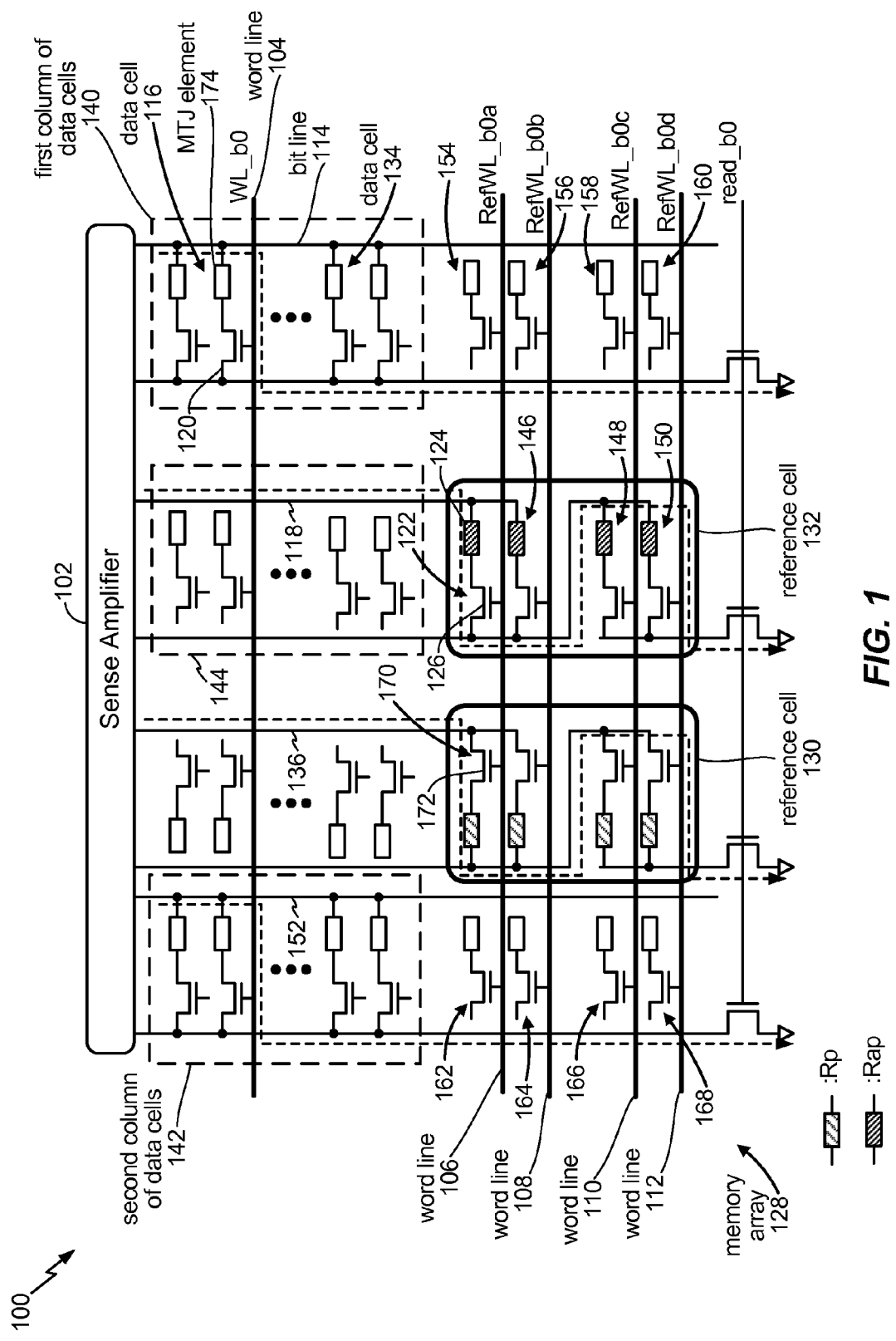
FIG. 1 is a block diagram of a particular illustrative embodiment of a magnetoresistive random-access memory (MRAM) device that includes a reference cell.

FIG. 1 illustrates a magnetoresistive random-access memory (MRAM) device 100 that includes a memory array or a memory bank (e.g., a memory array 128) coupled to a sense amplifier 102. The memory array 128 may include a plurality of columns of MTJ cells. Each MTJ cell may be configured to store a logic state (e.g., logic 0 or logic 1). Each MTJ cell may be implemented using the same type of components or circuitry. In a particular embodiment, each of the MTJ cells may be implemented using a single MTJ element coupled to a single transistor. For example, an MTJ cell 122 (illustrated as part of a reference cell 132) may include an MTJ element 124 coupled to a transistor 126. The single transistor of each particular MTJ cell may be configured to enable read access, write access, or both, to the MTJ element of the particular MTJ cell.

The memory array 128 may include a group of data cells that are coupled to respective bit lines and word lines. The group of data cells may include a plurality of columns of data cells (e.g., a first column of data cells 140, a second column of data cells 142). For example, the first column of data cells 140 includes a data cell 116 and a data cell 134. Each data cell may be an MTJ cell including a single MTJ element coupled to a single transistor. For example, the data cell 116 includes an MTJ element 174 coupled to a transistor 120. Each column of the data cells may correspond to a particular bit line. For example, the first column of data cells 140 corresponds to a bit line 114 and the second column of data cells 142 corresponds to a bit line 152. Each data cell in a column may be connected to its corresponding bit line and to a distinct word line. For example, the data cell 116 may be connected to the bit line 114 and to a word line 104.

The memory array 128 includes a reference cell 130 and the reference cell 132. Each reference cell 130, 132 includes multiple (e.g., four) MTJ cells. For example, the reference cell 132 includes MTJ cells 122, 146, 148, and 150. Each of the MTJ cells of a reference cell (e.g., the reference cell 130, the reference cell 132) may be connected to a distinct word line. For example, the MTJ cell 122 is connected to the word line 106, the MTJ cell 146 is connected to a word line 108, the MTJ cell 148 is connected to a word line 110, and the MTJ cell 150 is connected to a word line 112. Each of the MTJ cells of a reference cell (e.g., the reference cell 130, the reference cell 132) may be connected to a common bit line. For example, the MTJ cells 122, 146, 148, and 150 of the reference cell 132 are each connected to the bit line 118. As another example, the reference cell 130 has four MTJ cells that are connected to a bit line 136 and that are each connected to one of the word lines 106, 108, 110, and 112.

The MTJ cells of a reference cell (e.g., the reference cell 130, the reference cell 132) may be aligned with a column of MTJ cells. For example, the MTJ cells 122, 146, 148, and 150 of the reference cell 132 may be aligned with a column of MTJ cells 144. In contrast to the columns of data cells 140 and 142, the MTJ cells of the column of MTJ cells 144 are disconnected from their associated bit line (e.g., the bit line 118 associated with the column of MTJ cells 144).

Each MTJ cell of a reference cell (e.g., the reference cell 130, the reference cell 132) may also be aligned with a distinct row of a plurality of rows of MTJ cells. For example, the MTJ cell 122 may be aligned with a first row of MTJ cells, the MTJ cell 146 may be aligned with a second row of MTJ cells, the MTJ cell 148 may be aligned with a third row of MTJ cells, and the MTJ cell 150 may be aligned with a fourth row of MTJ cells. The first row of MTJ cells may include MTJ cells 154 and 162. The second row of MTJ cells may include MTJ cells 156 and 164. The third row of MTJ cells may include MTJ cells 158 and 166. The fourth row of MTJ cells may include MTJ cells 160 and 168. Each MTJ cell of the plurality of rows of MTJ cells may be disconnected from a corresponding bit line. For example, the MTJ cells 154, 156, 158, and 160 are disconnected from the bit line 114 and the MTJ cells 162, 164, 166, and 168 are disconnected from the bit line 152.

Data cells (e.g., in the columns of data cells 140, 142) may have the same structure as MTJ cells of the reference cells 130, 132. For example, the data cells and the reference cells may be implemented using MTJ cells that each includes a single MTJ element coupled to a single transistor. Utilizing MTJ cells having the same structure for the reference cells and the data cells may enable the reference cells to more accurately mimic electrical responses of the data cells to a signal (e.g., a voltage signal or a current signal) and to experience similar process, voltage, and temperature variations as the data cells. As a result, a more accurate reference voltage may be generated than by using MTJs having different structures for the reference cells than the data cells. A more accurate reference voltage may enable the sense amplifier 102 to more accurately determine a logic state stored at a data cell.

During a read operation, a data value stored at a data cell (e.g., the data cell 116) may be determined by providing a data voltage to the sense amplifier 102. The sense amplifier 102 may compare the data voltage to a reference voltage (e.g., from a corresponding reference cell). The sense amplifier 102 may amplify a result of the comparison to provide an output signal that indicates the data value stored at the data cell 116.

The data cell 116 may be activated via the word line 104 to provide the data voltage to the sense amplifier 102. For example, the word line 104 may turn on the transistor 120 to activate the data cell 116. A voltage applied to the first column of data cells 140 generates a data current that passes through the bit line 114, through the MTJ element 174, and through the transistor 120 to ground. By passing the data current through the data cell 116, the data voltage may be generated at an input to a comparison circuit of the sense amplifier 102.

As illustrated in FIG. 1, MTJ cells of one reference cell may store a first logic state (e.g., logic 0) and MTJ cells of another reference cell may store a second logic state (e.g., logic 1). For example, the MTJ cells of the reference cell 130 may store logic 0, and the MTJ cells of the reference cell 132 may store logic 1. The MRAM device 100 may be least susceptible to noise and other environmental factors when the reference voltage is centered between a first reference voltage of the reference cell 130 at the logic 0 state and a second reference voltage of the reference cell 132 at the logic 1 state, thus enhancing a sense margin of the data cell 116.

Both reference cells 130, 132 may be activated via multiple word lines to provide the first reference voltage and the second reference voltage to the sense amplifier 102. For example, the reference cell 130 and the reference cell 132 may be activated via the four word lines 106, 108, 110, and 112.

A voltage may be applied to each reference cell. For example, a first voltage may be applied to the reference cell 130 to generate a first reference current, and a second voltage may be applied to the reference cell 132 to generate a second reference current. The reference currents may be combined to produce a reference input to a comparison circuit of the sense amplifier 102, as described with reference to FIG. 3.

Using multiple MTJ cells in a reference cell may be used to mitigate (e.g., by averaging) variations that may occur in any single MTJ cell. For example, using four MTJ cells in a serially-coupled parallel pair configuration of each of the reference cells 130, 132 may result in the same effective resistance as a single MTJ cell with reduced cell-to-cell variation among reference cells.

Figure 2:
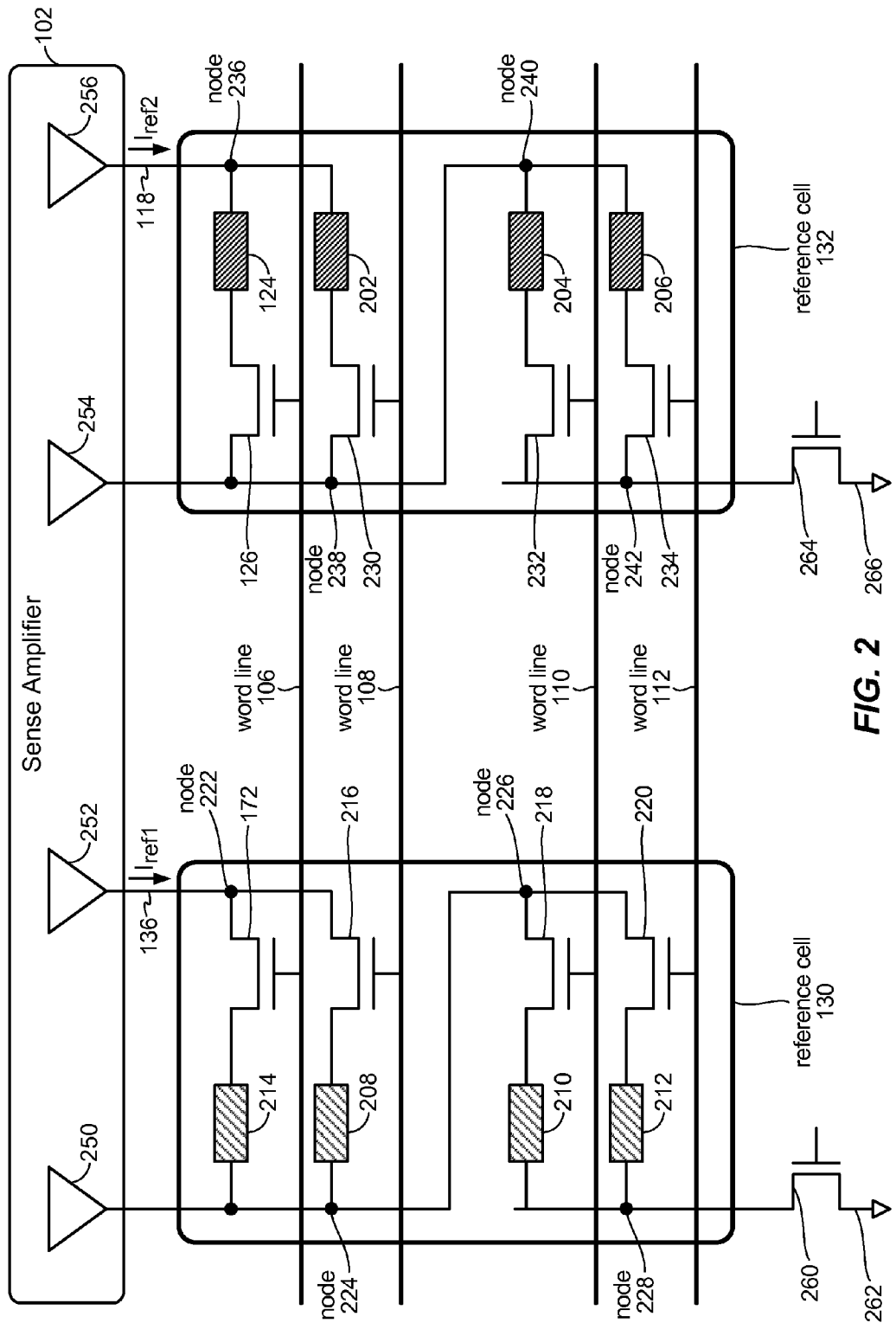
FIG. 2 illustrates operation of the reference cell of FIG. 1.
Figure 3:
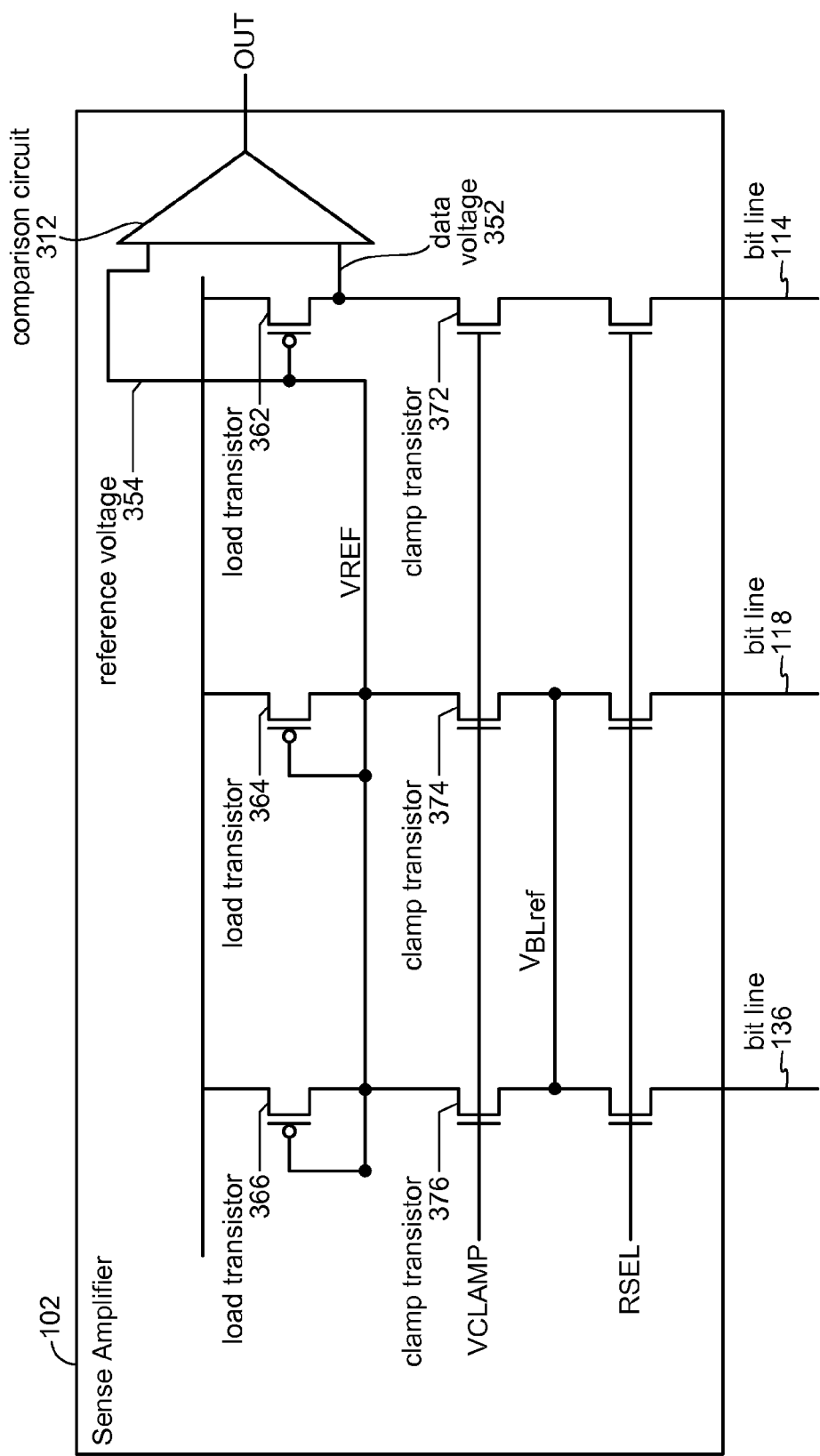
FIG. 3 illustrates operation of a sense amplifier that may be used by the MRAM device of FIG. 1.

FIGS. 2 and 3 illustrate operation of the reference cells 130, 132 and the sense amplifier 102 of FIG. 1. During a read operation, a first reference current (Iref1) may pass through the bit line 136. The first reference current may be divided into two currents at a node 222. One of the two currents from the node 222 may pass through the transistor 172 and through an MTJ element 214. The other of the two currents from the node 222 may pass through the transistor 216 and through an MTJ element 208. The current exiting the MTJ element 214 may be merged with the current exiting the MTJ element 208 at a node 224. The current from the node 224 may be divided into two currents at a node 226. One of the two currents from the node 226 may pass through the transistor 218 and through the MTJ element 210. The other current from the node 226 may pass through the transistor 220 and through the MTJ element 212. The current exiting from the MTJ element 210 may be merged with the current exiting through the MTJ element 212 at a node 228 and may flow to ground.

In addition, a second reference current (Iref2) may pass through the bit line 118. The second reference current may be divided into two currents at a node 236. One of the two currents from the node 236 may pass through the MTJ element 124 and through the transistor 126. The other of the two currents from the node 236 may pass through an MTJ element 202 and through a transistor 230. The current exiting the transistor 126 may be merged with the current exiting the transistor 230 at a node 238. The current from the node 238 may be divided into two currents at a node 240. One current from the node 240 may pass through an MTJ element 204 and through a transistor 232. The other current from the node 240 may pass through an MTJ element 206 and through a transistor 234. The current exiting from the transistor 232 may be merged with the current exiting through the transistor 234 at a node 242 and may flow to ground.

By coupling the reference cells 130, 132 in parallel, a reference voltage is generated corresponding to an average resistance of the reference cell 130 and the reference cell 132 and an average current of the first reference current (Iref1) and the second reference current (Iref2). The reference voltage may be provided to an input of a comparison circuit of the sense amplifier 102.

The effective resistance (first resistance value) of the reference cell 130 may be equal to a sum of the average resistance of the MTJ elements 214, 208, 210, and 212 and the average resistance of the transistors 172, 216, 218, and 220. The effective resistance (second resistance value) of the reference cell 132 may be equal to a sum of the average resistance of the MTJ elements 124, 202, 204, and 206 and the average resistance of the transistors 126, 230, 232, and 234. Thus, the effective resistance of each of the reference cells 130, 132 may correspond to an effective resistance of a reference cell with a single MTJ cell with reduced cell-to-cell variation.

During a write operation, the MTJ elements (e.g., the MTJ elements 214, 208, 210, and 212 and the MTJ elements 124, 202, 204, and 206) of a reference cell (e.g., the reference cell 130 and the reference cell 132) may be programmed via programming currents to have different resistance values. The reference cell 130 and the reference cell 132 may be activated via the four word lines 106, 108, 110, and 112 so that the MTJ elements 214, 208, 210, and 212 and the MTJ elements 124, 202, 204, and 206 may be programmed. In a particular embodiment, a current used to write a value to an MTJ element of a reference cell (e.g., the programming current) may be much larger than a current used to read a value from the MTJ element of the reference cell (e.g., a reference current). In this embodiment, a multiple step process may be used to program the MTJ elements of the reference cell. For example, as described further below, one word line may be activated at a time, and the MTJ elements coupled to the activated word line may be programmed while other MTJ elements of the reference cell are inactive. Subsequently, another word line may be activated to enable programming of another set of MTJ elements.

In an illustrative embodiment, the MTJ elements 214, 208, 210, and 212 of the reference cell 130 and the MTJ elements 124, 202, 204, and 206 of the reference cell 132 may be programmed by programming current applied by drivers 250, 252, 254 and 256 of the sense amplifier 102. In this embodiment, a first word line, such as the word line 106, may be activated. While the word line 106 is activated, programming currents may be applied to the bit line 136 and to the bit line 118. For example, the driver 252 may be set "high" (corresponding to a high voltage) and the driver 250 may be set "low" (corresponding to a low voltage), providing a current path through the transistor 172 and the MTJ element 214 from the driver 252 to the driver 250. Likewise, the driver 256 may be set "high" (corresponding to a high voltage) and the driver 254 may be set "low" (corresponding to a low voltage), providing a current path through the transistor 126 and the MTJ element 124 from the driver 256 to the driver 254.

After the MTJ elements 214 and 124 associated with the word line 106 have been programmed, the word line 106 may be deactivated and the word line 108 may be activated. Deactivating the word line 106 and activating the word line 108 provides a current path from the driver 252 to the driver 250 to program the MTJ element 208 and provides a current path from the driver 256 to the driver 254 to program the MTJ element 202.

After the MTJ elements 208 and 202 associated with the word line 108 have been programmed, the word line 108 may be deactivated and the word line 110 may be activated. Programming currents may be applied to the reference cells 130 and 132 by setting the driver 250 "high" (corresponding to a high voltage) relative to a ground 262, and by setting the driver 254 "high" (corresponding to a high voltage) relative to a ground 266. Transistors 260 and 264 (e.g., NMOS transistors) may act as pull-down transistors to activate or enable the current path to grounds 262 and 266, respectively. With the word line 110 activated, current paths through the MTJ element 210 and the MTJ element 204 are provided.

After the MTJ elements 210 and 204 associated with the word line 110 have been programmed, the word line 110 may be deactivated and the word line 112 may be activated. Deactivating the word line 110 and activating the word line 112 provides a current path from the driver 250 to the ground 262 to program the MTJ element 212 and provides a current path from the driver 254 to the ground 266 to program the MTJ element 206.

Although a particular sequence of programming the MTJ elements 214, 208, 210, 212, 124, 202, 204, and 206 of the reference cells 130 and 132 is described above, in other embodiments, the MTJ elements 214, 208, 210, 212, 124, 202, 204, and 206 may be programmed in a different sequence. For example, the word lines 106, 108, 110, and 112 may be activated in a different order to program the MTJ elements 214, 208, 210, 212, 124, 202, 204, and 206. In another example, a direction of current flow (e.g., from a high voltage driver to a low voltage driver or ground) may be changed to program a particular MTJ element to have another logical value.

In a particular embodiment, MTJ elements (e.g., the MTJ elements 214, 208, 210, and 212 and the MTJ elements 124, 202, 204, and 206) of a reference cell (e.g., the reference cell 130 and the reference cell 132) may be programmed when a threshold number of write operations are performed on data cells (e.g., the data cell 116). For example, when the threshold number is one, the MTJ elements of the reference cell may be programmed each time a write operation is performed on any data cell. Programming the MTJ elements of the reference cell based on the write operations on data cells may reduce variations between the MTJ elements of the reference cell and the data cells that may develop over time.

Referring to FIG. 3, the sense amplifier 102 may include a first load transistor (e.g., a load transistor 362) coupled to a bit line corresponding to a data cell. For example, the load transistor 362 is coupled to the bit line 114 corresponding to the data cell 116. The sense amplifier 102 may include a second load transistor (e.g., a load transistor 366) coupled to a bit line corresponding to a first reference cell and may include a third load transistor (e.g., a load transistor 364) coupled to a bit line corresponding to a second reference cell. For example, the load transistor 366 is coupled to the bit line 136 corresponding to the reference cell 130 and the load transistor 364 is coupled to the bit line 118 corresponding to the reference cell 132.

Each of the load transistors may be coupled to a clamp transistor. For example, the load transistors 362, 364, and 366 are coupled to clamp transistors 372, 374, and 376, respectively. Each of the clamp transistors 372, 374, and 376 may function to limit current and voltage based on a common gate voltage, VCLAMP. The sense amplifier 102 may include a comparison circuit (e.g., a comparison circuit 312).

During a read operation, the sense amplifier 102 may activate the bit lines 136 and 118 to generate a reference voltage VREF 354 from the reference cells 130 and 132 at the sense amplifier 102, as described with reference to FIGS. 1-2. The bit lines 118, 136 are coupled in parallel and have a voltage VBLref at the output of the clamp transistors 374, 376. In addition, the sense amplifier 102 may activate the bit line 114 to generate a data voltage 352 at the sense amplifier 102, as described with reference to FIG. 1. The reference voltage 354 and the data voltage 352 may be provided to inputs of the comparison circuit 312. The comparison circuit 312 may output a signal representing the data value stored at the data cell 116 based on a comparison of the reference voltage 354 and the data voltage 352.

The reference current through the reference cell 130 may correspond to a current through an effective resistance of a single MTJ cell storing a first logic state (e.g., logic 0). The reference current through the reference cell 132 may correspond to a current through an effective resistance of a single MTJ cell storing a second logic state (e.g., logic 1). The reference voltage 354 may therefore be generated according to a current-mean reference scheme with reduced cell-to-cell variation.

Figure 4:
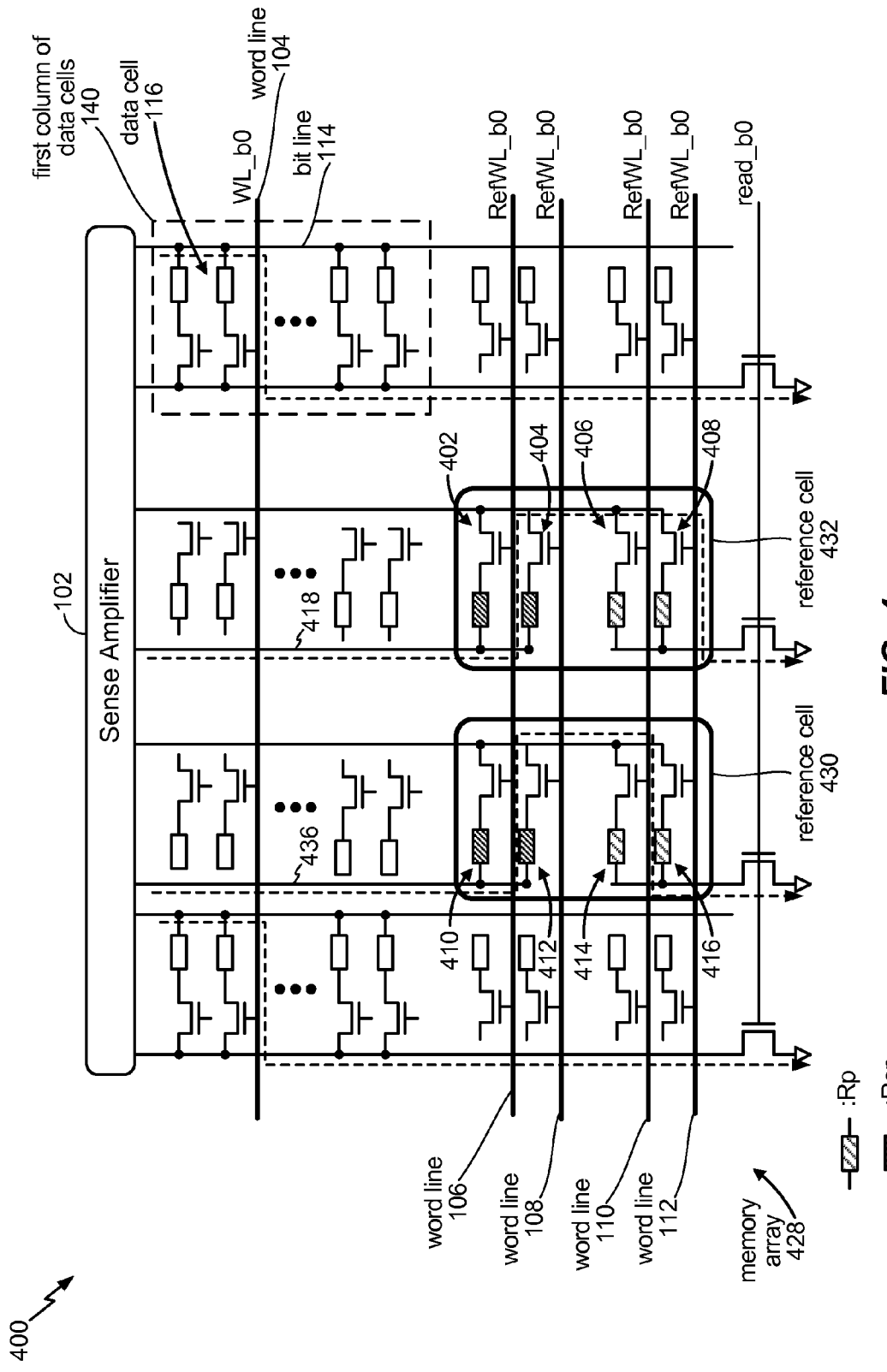
FIG. 4 is a diagram of another illustrative embodiment of a MRAM device that includes a reference cell.

Referring to FIG. 4, a diagram of another particular embodiment of a MRAM device is disclosed and is generally designated 400. The MRAM device 400 includes a memory array (e.g., a memory array 428) coupled to the sense amplifier 102 of FIG. 1. The memory array 428 may include a plurality of columns of MTJ cells. The memory array 428 includes the data cell 116 of FIG. 1, a reference cell 430, and a reference cell 432. Each reference cell 430, 432 includes multiple (e.g., four) MTJ cells. For example, the reference cell 430 includes MTJ cells 410, 412, 414, and 416. Each of the MTJ cells of a reference cell (e.g., the reference cells 430, 432) may be connected to a distinct word line. For example, the MTJ cells 410, 412, 414, and 416 are connected to the word lines 106, 108, 110, 112, respectively. Each of the MTJ cells of a reference cell (e.g., the reference cells 430, 432) may be connected to a bit line. For example, the MTJ cells 410, 412, 414, and 416 are each connected to the bit line 436. As another example, the reference cell 432 has four MTJ cells 402, 404, 406, and 408 that are each connected to the bit line 418 and that are each connected to one of the word lines 106, 108, 110, and 112, respectively.

As illustrated in FIG. 4, a first subset of MTJ cells of a reference cell may store a first logic state (e.g., logic 0) and a second subset of MTJ cells of the reference cell may store a second logic state (e.g., logic 1). For example, the MTJ cells 410 and 412 of the reference cell 430 may store logic 1 and the MTJ cells 414 and 416 of the reference cell 430 may store logic 0. As another example, the MTJ cells 402 and 404 of the reference cell 432 may store logic 1 and the MTJ cells 406 and 408 of the reference cell 432 may store logic 0.

During a read operation, a data voltage may be provided to the sense amplifier 102 by passing a data current through the data cell 116, as described with reference to FIG. 1. A reference voltage may be generated by a reference current through the reference cell 430 or the reference cell 432, which functions as a resistance-mean reference. Using more MTJ cells in a reference cell may reduce the effect of variations that may occur in MTJ cells by averaging the effect of variations. Alternatively, more than one reference cell may be activated (e.g., both reference cells 430 and 432 may be activated) to further reduce an effect of MTJ cell variation on the reference voltage.

Figure 5:
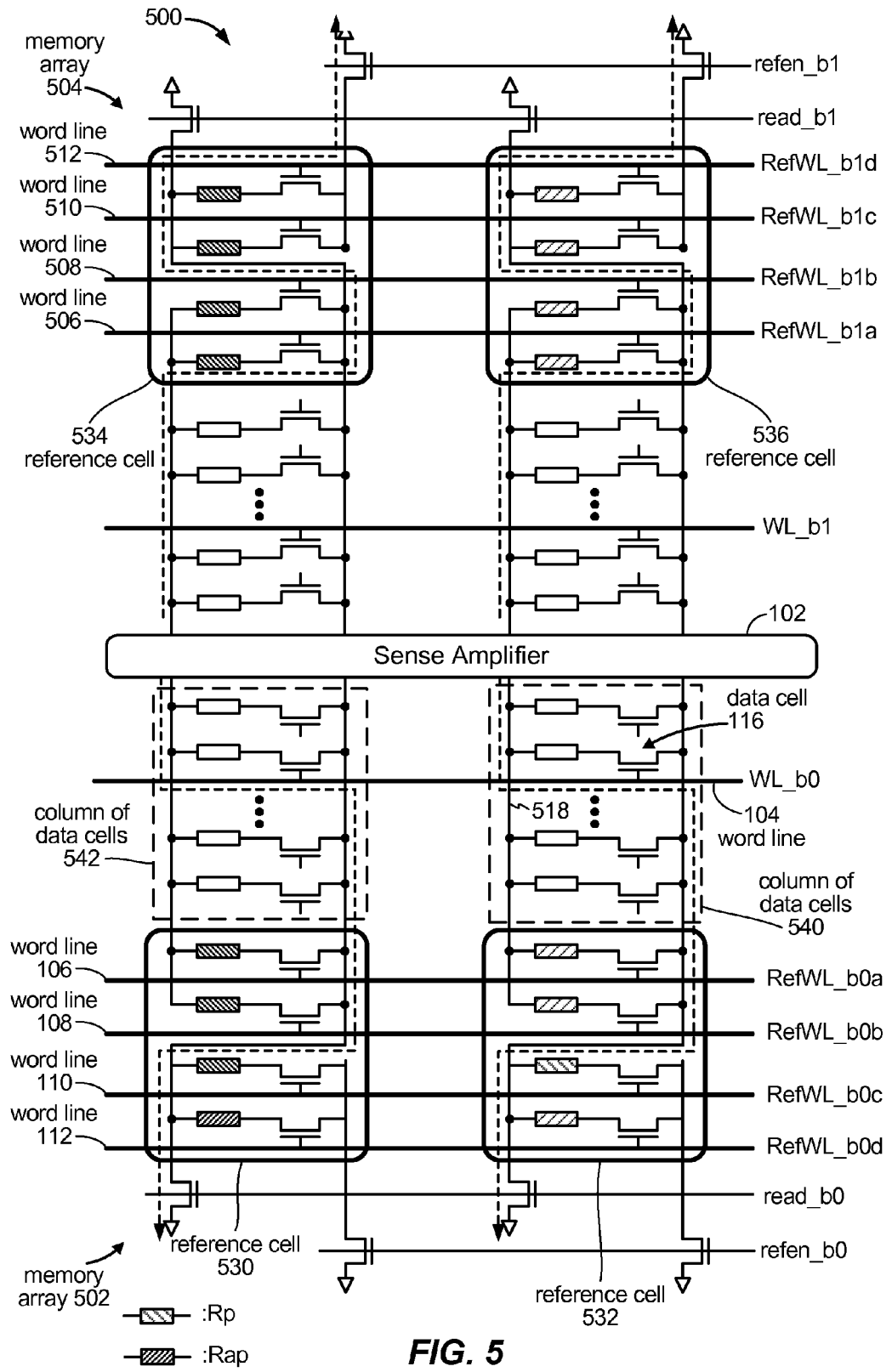
FIG. 5 is a diagram of another illustrative embodiment of a MRAM device that includes a reference cell.

Referring to FIG. 5, a particular embodiment of a MRAM device is disclosed and is generally designated 500. The MRAM device 500 may include multiple (e.g., two) memory arrays or banks coupled to a sense amplifier. For example, the MRAM device 500 includes memory arrays 502, 504 coupled to the sense amplifier 102 of FIG. 1. Each memory array 502, 504 includes a plurality of columns of MTJ cells. A column of the MTJ cells may include a data cell, a reference cell, or both. For example, a column of MTJ cells includes a column of data cells 540 and a reference cell 532. As an additional example, another column of MTJ cells includes a column of data cells 542 and a reference cell 530. Each MTJ cell of a column of MTJ cells may be connected to a distinct word line. For example, each MTJ cell of the reference cells 530, 532 in the memory array 502 is connected to a word line (e.g., word lines 106, 108, 110, and 112). Each MTJ cell of the reference cells 534, 536 in the memory array 504 is connected to a word line (e.g., word lines 506, 508, 510, and 512). The data cell 116 is in the same column of MTJ cells as the reference cell 532 and is connected to the word line 104. Each MTJ cell of a column of MTJ cells may be connected to a common bit line. For example, the column of data cells 540 and the reference cell 532 are connected to a bit line 518. As illustrated in FIG. 5, the reference cells 536 and 532 store a first logic value (e.g., logic 0) and the reference cells 534 and 530 store a second logic value (e.g., logic 1).

During a read operation, a data voltage may be provided to the sense amplifier 102 by a memory array of the MRAM device 500, and a reference voltage may be provided to the sense amplifier 102 by another memory array of the MRAM device 500. For example, during a read operation of the data cell 116 of the memory array 502, a reference voltage may be provided according to a current-mean scheme by the reference cells 534, 536 of the memory array 504, such as described with reference to FIGS. 2 and 3. Providing the reference voltages from a different memory array than the memory array from which data is being read may reduce (or eliminate) the number of disconnected MTJ cells in the MRAM device 500 (e.g., as compared to the memory array 128 of FIG. 1) thereby increasing a storage density of the MRAM device 500.

Figure 6:
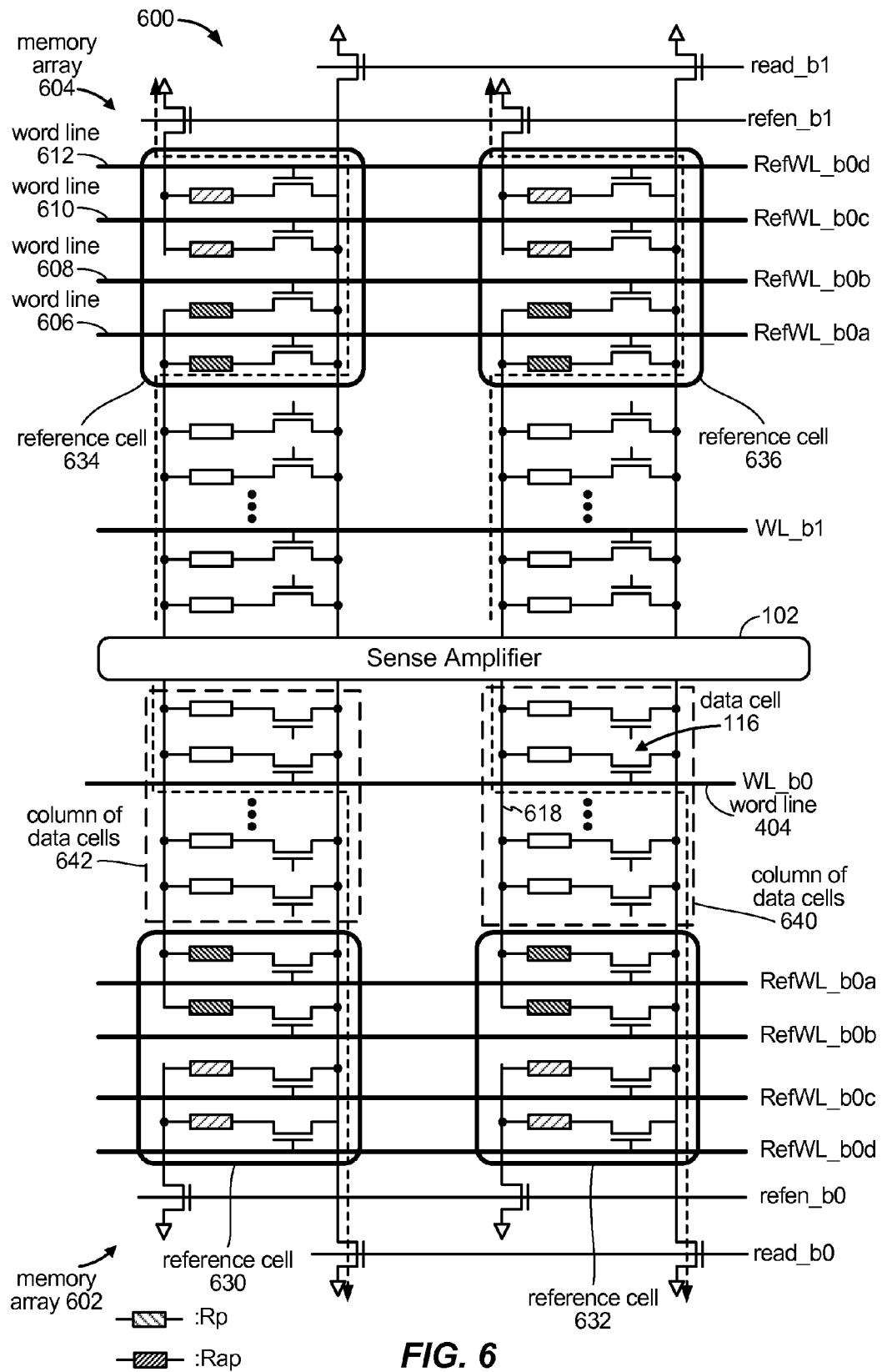
FIG. 6 is a diagram of another illustrative embodiment of a MRAM device that includes a reference cell.

Referring to FIG. 6, another particular embodiment of a MRAM device is disclosed and is generally designated 600. The MRAM device 600 may include multiple (e.g., two) memory arrays or banks coupled to a sense amplifier. For example, the MRAM device 600 includes memory arrays 602, 604 coupled to the sense amplifier 102 of FIG. 1. Components of the MRAM device 600 may operate in a similar manner as corresponding components of the MRAM device 500 of FIG. 5. However, reference cells 630, 632, 634, and 636 of the MRAM device 600 are configured to operate according to a resistance-mean reference scheme, such as described with reference to FIG. 4.

Figure 7:
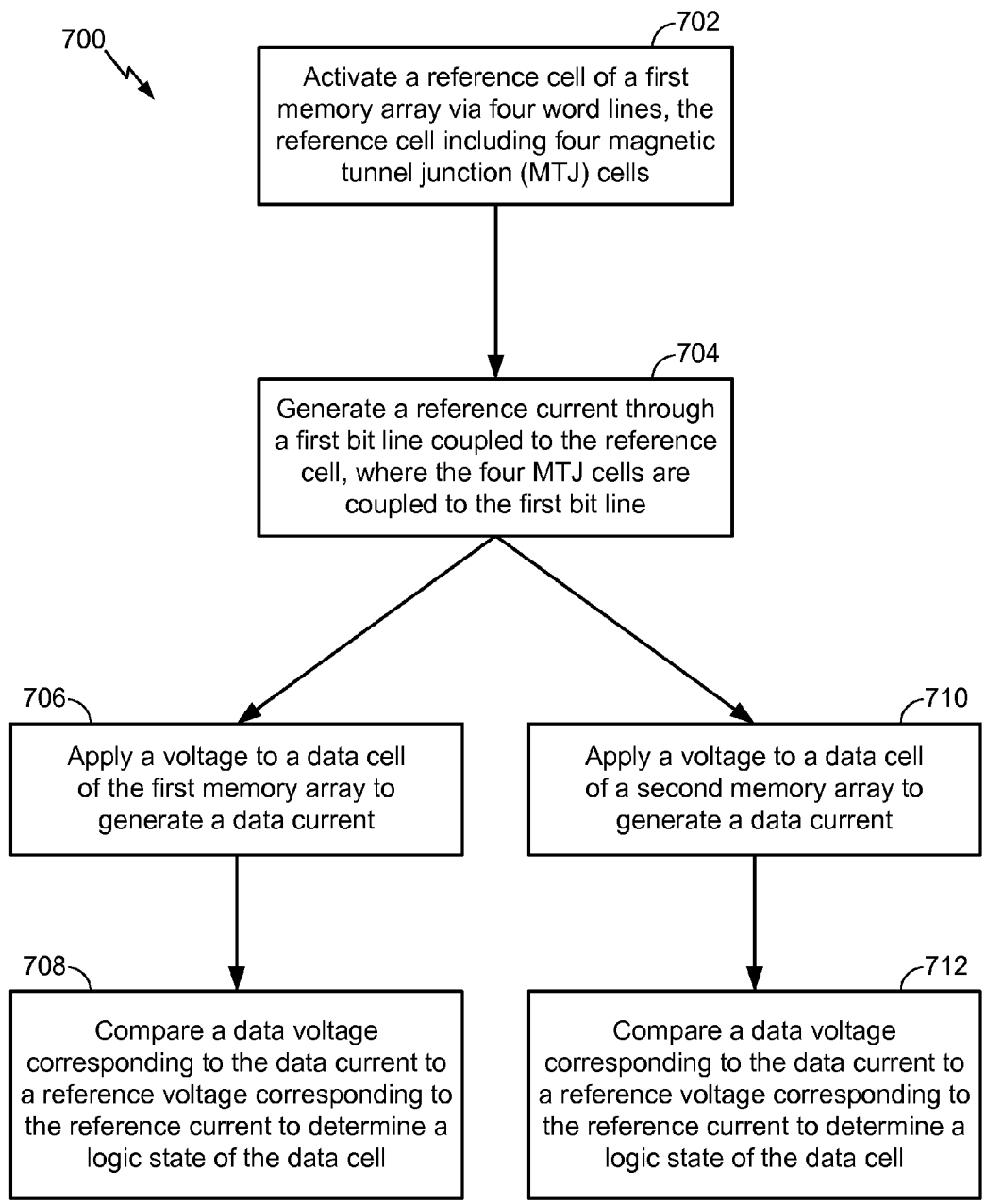
FIG. 7 is a flow chart of a particular illustrative embodiment of a method of providing a reference voltage.

Referring to FIG. 7, a method of providing a reference voltage using multiple magnetic storage elements is disclosed and is generally designated 700. The method 700 may be implemented by the MRAM device 100 of FIG. 1, the MRAM device 400 of FIG. 4, the MRAM device 500 of FIG. 5, the MRAM device 600 of FIG. 6, or a combination thereof.

The method 700 includes activating a reference cell of a first memory array via four word lines, the reference cell including four magnetic tunnel junction (MTJ) cells, at 702. For example, the device 100 of FIG. 1 may activate the reference cell 130 and the reference cell 132 of the memory array 128 via the word lines 106, 108, 110, and 112, as further described with reference to FIG. 1. As another example, the device 600 of FIG. 6 may activate the reference cell 634, the reference cell 636, or both, of the memory array 604 via the word lines 606, 608, 610, and 612, as further described with reference to FIG. 6.

The method 700 may also include generating a reference current through a first bit line coupled to the reference cell, where the four MTJ cells are coupled to the first bit line, at 704. For example, the device 100 of FIG. 1 may generate a first reference current through the bit line 136 coupled to the reference cell 130 and a second reference current through the bit line 118 coupled to the reference cell 132, as further described with reference to FIG. 1. As another example, the device 600 of FIG. 6 may generate a first reference current through a first bit line coupled to the reference cell 534, a second bit line coupled to the reference cell 536, or both, as further described with reference to FIG. 1.

The method 700 further includes applying a voltage to a data cell of the first memory array to generate a data current, at 706, and comparing a data voltage corresponding to the data current to a reference voltage corresponding to the reference current to determine a logic state of the data cell, at 708. For example, the data cell and the reference cell may be in a same memory array, such as the memory array 128 of FIG. 1 or the memory array 428 of FIG. 4. To illustrate, the device 100 of FIG. 1 may apply a voltage to the data cell 116 of the memory array 128 to generate a data current, as further described with reference to FIG. 1. The sense amplifier of 102 of FIG. 1 may compare a data voltage corresponding to the data cell 116 to a reference voltage corresponding to the reference current generated using the reference cells 130 and 132, as further described with reference to FIGS. 1 and 2.

Alternatively, the method 700 may include applying a voltage to a data cell of a second memory array to generate a data current, at 710, and comparing a data voltage corresponding to the data current to a reference voltage corresponding to the reference current to determine a logic state of the data cell, at 712. For example, the data cell and the reference cell may be in distinct memory arrays, such as one of the data cell and the reference cell in the memory array 502 and the other of the data cell and the reference cell in the memory array 504 of FIG. 5 (or one of the data cell and the reference cell in the memory array 602 and the other of the data cell and the reference cell in the memory array 604 of FIG. 6). To illustrate, the device 600 of FIG. 6 may apply a voltage to the data cell 116 of the memory array 602 to generate a data current, as further described with reference to FIG. 6. The sense amplifier of 102 of FIG. 1 may compare a data voltage corresponding to the data cell 116 to a reference voltage corresponding to the reference current generated using the reference cell 634, the reference cell 636, or both, of the memory array 604, as further described with reference to FIGS. 2 and 6.

The method of FIG. 7 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 7 can be performed by a processor that executes instructions, as described with respect to FIG. 8.

Thus, the method 700 may provide a reference current from a reference cell that reduces the effect of resistance value variations of individual reference MTJ elements on the reference current.

Figure 8:
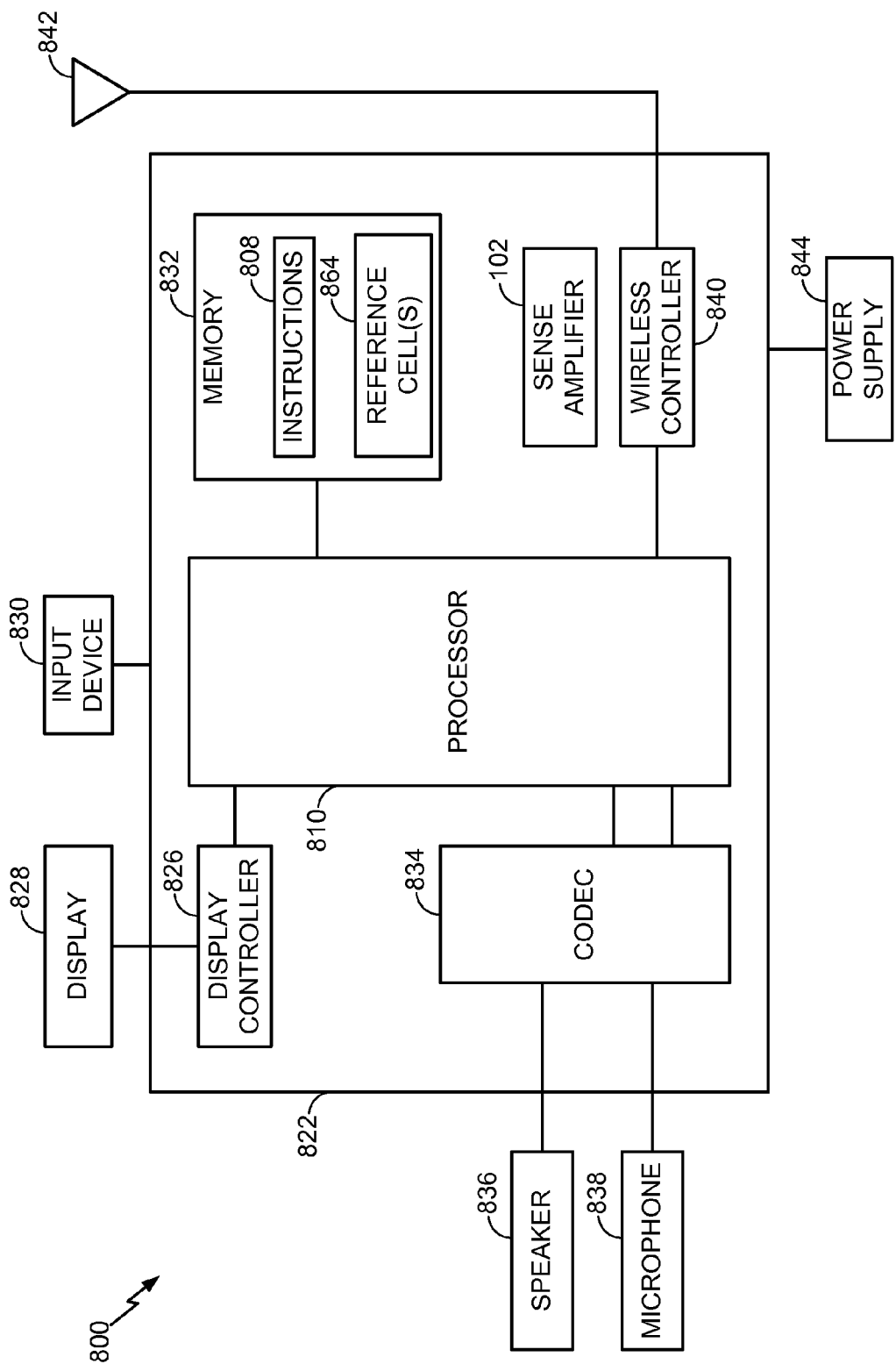
FIG. 8 is a block diagram of portable device including a reference cell.

Referring to FIG. 8, a block diagram of a particular illustrative embodiment of a device is depicted and generally designated 800. In an illustrative embodiment, the device 800 includes the device 100 of FIG. 1, the device 400 of FIG. 4, the device 500 of FIG. 5, or the device 600 of FIG. 6. The device 800 includes a processor 810 (e.g., a digital signal processor (DSP)) coupled to a memory 832. The device 800 may include a sense amplifier (e.g., the sense amplifier 102 of FIG. 1). The memory 832 includes one or more reference cells 864. In an illustrative embodiment, the one or more reference cells 864 may correspond to the reference cell 130, 132 of FIG. 1, the reference cell 430, 432 of FIG. 4, the reference cell 530, 532, 534, 536 of FIG. 5, the reference cell 630, 632, 634, 636 of FIG. 6, or any combination thereof.

Further the operations/method described in FIG. 7, or certain portions thereof, may be performed at or by the device 800, or components thereof.

The memory 832 may be a non-transitory tangible computer-readable and/or processor-readable storage device that stores instructions 808. The instructions 808 may be executable by the processor 810 to perform one or more functions, such as the operations/method described with reference to FIG. 7. The memory 832 may be implemented using a MRAM device, such as the device 100 of FIG. 1, the device 400 of FIG. 4, the device 500 of FIG. 5, or the device 600 of FIG. 6. The one or more reference cells 864 of the memory 832 may be configured to provide a resistance value to be used by the sense amplifier 102.

FIG. 8 also shows a display controller 826 that is coupled to the processor 810 and to a display 828. A coder/decoder (CODEC) 834 may be coupled to the processor 810. A speaker 836 and a microphone 838 may be coupled to the CODEC 834.

FIG. 8 also indicates that a wireless controller 840 may be coupled to the processor 810 and to a wireless antenna 842. In a particular embodiment, the processor 810, the display controller 826, the memory 832, the CODEC 834, and the wireless controller 840 are included in a system-in-package or system-on-chip device 822. In a particular embodiment, an input device 830 and a power supply 844 are coupled to the system-on-chip device 822. Moreover, in a particular embodiment, as illustrated in FIG. 8, the display 828, the input device 830, the speaker 836, the microphone 838, the wireless antenna 842, and the power supply 844 are external to the system-on-chip device 822. However, each of the display 828, the input device 830, the speaker 836, the microphone 838, the wireless antenna 842, and the power supply 844 can be coupled to a component of the system-on-chip device 822, such as an interface or a controller.

In conjunction with the described embodiments, an apparatus may include means for storing data, such as the device 100 of FIG. 1, the device 400 of FIG. 4, the device 500 of FIG. 5, the device 600 of FIG. 6, one or more other devices or circuits configured to store data, or any combination thereof. The apparatus may also include means for providing a resistance value, such as the reference cell 130, 132 of FIG. 1, the reference cell 430, 432 of FIG. 4, the reference cell 530, 532, 534, 536 of FIG. 5, the reference cell 630, 632, 634, 636 of FIG. 6, one or more other devices or circuits configured to provide a resistance value, or any combination thereof.

Figure 9:
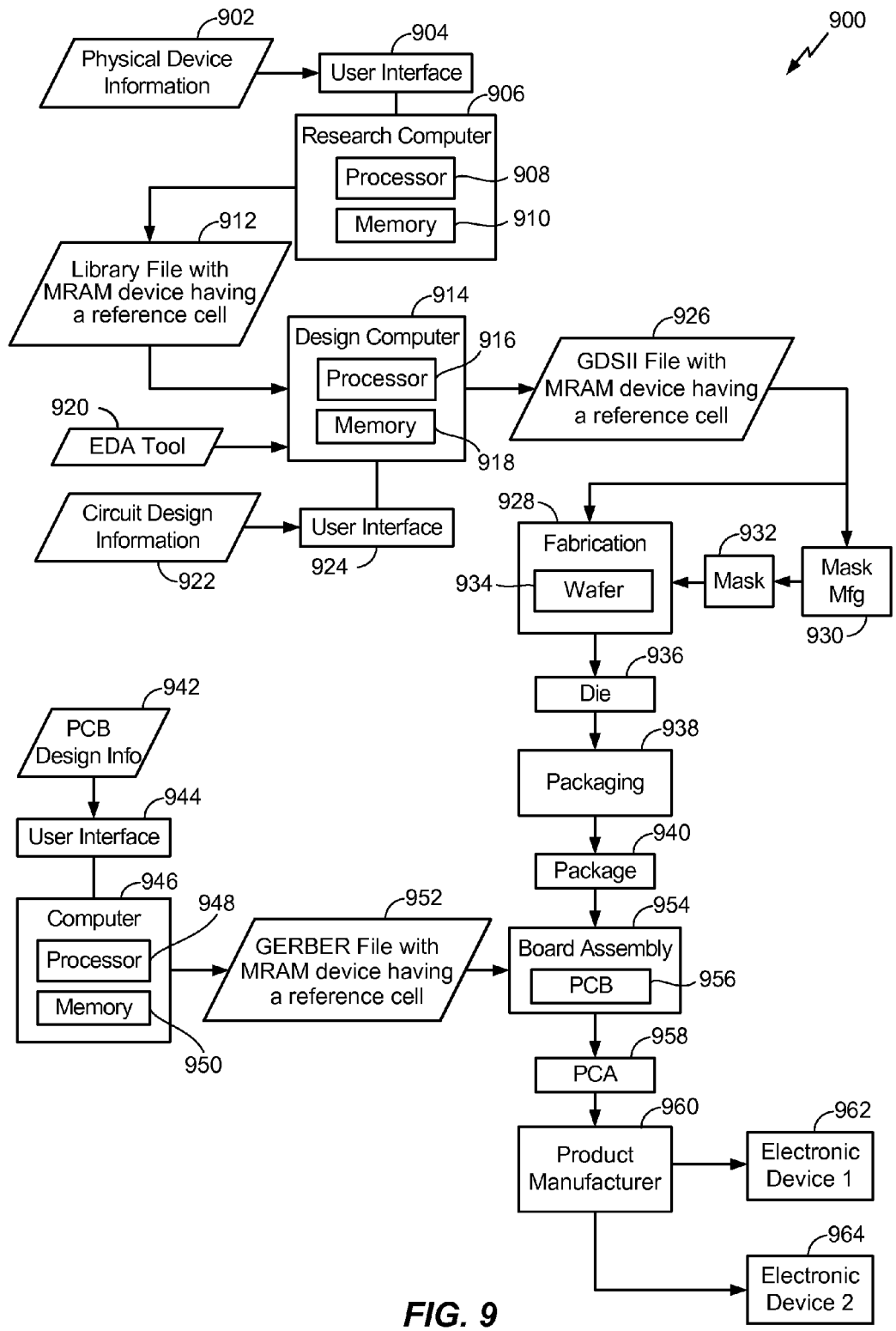
FIG. 9 is a data flow diagram of a particular illustrative embodiment of a manufacturing process to manufacture electronic devices that include a reference cell.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 9 depicts a particular illustrative embodiment of an electronic device manufacturing process 900.

Physical device information 902 is received at the manufacturing process 900, such as at a research computer 906. The physical device information 902 may include design information representing at least one physical property of a semiconductor device, such as the device 100 of FIG. 1, the device 400 of FIG. 4, the device 500 of FIG. 5, the device 600 of FIG. 6, the device 800 of FIG. 8, or any combination thereof. For example, the physical device information 902 may include physical parameters, material characteristics, and structure information that is entered via a user interface 904 coupled to the research computer 906. The research computer 906 includes a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may include a library of semiconductor devices including a device that includes the device 100 of FIG. 1, the device 400 of FIG. 4, the device 500 of FIG. 5, the device 600 of FIG. 6, the device 800 of FIG. 8, or any combination thereof, that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including the device 100 of FIG. 1, the device 400 of FIG. 4, the device 500 of FIG. 5, the device 600 of FIG. 6, the device 800 of FIG. 8, or any combination thereof, of the library file 912. For example, a user of the design computer 914 may enter circuit design information 922 via a user interface 924 coupled to the design computer 914. The circuit design information 922 may include design information representing at least one physical property of a semiconductor device, such as the device 100 of FIG. 1, the device 400 of FIG. 4, the device 500 of FIG. 5, the device 600 of FIG. 6, the device 800 of FIG. 8, or any combination thereof. To illustrate, the circuit design property may include identification of particular circuits and relationships to other elements in a circuit design, positioning information, feature size information, interconnection information, or other information representing a physical property of a semiconductor device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the device 100 of FIG. 1, the device 400 of FIG. 4, the device 500 of FIG. 5, the device 600 of FIG. 6, the device 800 of FIG. 8, or any combination thereof, in addition to other circuits or information. To illustrate, the data file may include information corresponding to a system-on-chip (SOC) that includes the device 100 of FIG. 1, the device 400 of FIG. 4, the device 500 of FIG. 5, the device 600 of FIG. 6, the device 800 of FIG. 8, and that also includes additional electronic circuits and components within the SOC.

The GDSII file 926 may be received at a fabrication process 928 to manufacture the device 100 of FIG. 1, the device 400 of FIG. 4, the device 500 of FIG. 5, the device 600 of FIG. 6, the device 800 of FIG. 8, or any combination thereof, according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process to generate one or more wafers 934, which may be tested and separated into dies, such as a representative die 936. The die 936 includes a circuit including a device that includes the device 100 of FIG. 1, the device 400 of FIG. 4, the device 500 of FIG. 5, the device 600 of FIG. 6, the device 800 of FIG. 8, or any combination thereof.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged semiconductor device on a circuit board, the packaged semiconductor device corresponding to the package 940 including the device 100 of FIG. 1, the device 400 of FIG. 4, the device 500 of FIG. 5, the device 600 of FIG. 6, the device 800 of FIG. 8, or any combination thereof.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the device 100 of FIG. 1, the device 400 of FIG. 4, the device 500 of FIG. 5, the device 600 of FIG. 6, the device 800 of FIG. 8, or any combination thereof. In other embodiments, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a set top box, a music player, a video player, an entertainment unit, a navigation device, a communications device, a personal digital assistant (PDA), a fixed location data unit, and a computer, into which the device 100 of FIG. 1, the device 400 of FIG. 4, the device 500 of FIG. 5, the device 600 of FIG. 6, the device 800 of FIG. 8, or any combination thereof, is integrated. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 9 illustrates remote units according to teachings of the disclosure, the disclosure is not limited to these illustrated units. Embodiments of the disclosure may be suitably employed in any device which includes active integrated circuitry including memory and on-chip circuitry.

A device that includes the device 100 of FIG. 1, the device 400 of FIG. 4, the device 500 of FIG. 5, the device 600 of FIG. 6, the device 800 of FIG. 8, or any combination thereof, may be fabricated, processed, and incorporated into an electronic device, as described in the illustrative process 900. One or more aspects of the embodiments disclosed with respect to FIGS. 1-8 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof. Although various representative stages of production from a physical device design to a final product are depicted, in other embodiments fewer stages may be used or additional stages may be included. Similarly, the process 900 may be performed by a single entity or by one or more entities performing various stages of the process 900.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a group of data cells; and
   a reference cell coupled to the group of data cells, wherein the reference cell comprises:
   a first magnetic tunnel junction (MTJ) element connected in parallel with a second MTJ element, wherein the first MTJ element is connected in series between a first transistor and a common node, wherein the second MTJ element is connected in series between a second transistor and the common node; and
   a third MTJ element connected in parallel with a fourth MTJ element, wherein a third transistor is connected in series between the common node and the third MTJ element, wherein a fourth transistor is connected in series between the common node and the fourth MTJ element,
   wherein each of the four MTJ elements is coupled to a distinct word line,
   and wherein each of the four transistors is configured to enable read access to the corresponding MTJ element.

2. The apparatus of claim 1, wherein the group of data cells comprises a plurality of data cells that correspond to a bit line.

3. The apparatus of claim 1, wherein the four MTJ elements are coupled to a common bit line.

4. The apparatus of claim 3, wherein the four MTJ elements are aligned with a single column of MTJ elements.

5. The apparatus of claim 4, wherein the column of MTJ elements is disconnected from the common bit line.

6. The apparatus of claim 1, wherein each of the four MTJ elements is aligned with a distinct row of a plurality of rows of MTJ elements.

7. The apparatus of claim 6, wherein the first MTJ element of the four MTJ elements is coupled to a first word line, wherein the first MTJ element is aligned with a first row of the plurality of rows of MTJ elements, and wherein the first row is disconnected from the first word line.

8. The apparatus of claim 1, wherein each data cell of the group of data cells comprises an MTJ element and wherein MTJ elements of the group of data cells have the same structure as MTJ elements of the reference cell.

9. The apparatus of claim 8, wherein the group of data cells and the reference cell are implemented using MTJ elements that are coupled to transistors.

10. The apparatus of claim 1, wherein the reference cell is configured to provide a first resistance value and wherein a reference voltage is determined according to a resistance-mean reference scheme based at least in part on the first resistance value.

11. The apparatus of claim 1, wherein the reference cell is configured to provide a first resistance value and wherein a reference voltage is determined according to a current-mean reference scheme based at least in part on the first resistance value.

12. The apparatus of claim 1, wherein the reference cell and the group of data cells are integrated into one of a set top box, a music player, a video player, an entertainment unit, a navigation device, a communications device, a personal digital assistant (PDA), a fixed location data unit, or a computer.

13. A method comprising:
   activating a reference cell of a first memory array via four word lines, the reference cell including:
   a first magnetic tunnel junction (MTJ) element connected in parallel with a second MTJ element, wherein the first MTJ element is connected in series between a first transistor and a common node, wherein the second MTJ element is connected in series between a second transistor and the common node; and
   a third MTJ element connected in parallel with a fourth MTJ element, wherein a third transistor is connected in series between the common node and the third MTJ element, wherein a fourth transistor is connected in series between the common node and the fourth MTJ element; and
   generating a reference current through a first bit line coupled to the reference cell, wherein the four MTJ elements are coupled to the first bit line.

14. The method of claim 13, further comprising:
   applying a voltage to a data cell of a second memory array to generate a data current; and
   comparing a data voltage corresponding to the data current to a reference voltage corresponding to the reference current to determine a logic state of the data cell.

15. The method of claim 13, wherein the first memory array comprises a plurality of columns of data cells and corresponding bit lines and wherein the corresponding bit lines include the first bit line.

16. The method of claim 15, wherein the four MTJ elements are aligned with a first column of data cells of the plurality of columns of data cells.

17. The method of claim 16, wherein the column of data cells is coupled to the first bit line.

18. The method of claim 17, further comprising:
   applying a voltage to a data cell of the first memory array to generate a data current; and
   comparing a data voltage corresponding to the data current to a reference voltage corresponding to the reference current to determine a logic state of the data cell.

19. The method of claim 18, wherein a second column of data cells of the plurality of columns of data cells comprises the data cell and wherein the second column of data cells is coupled to a second bit line.

20. The method of claim 13, wherein the first MTJ element of the four MTJ elements and the second MTJ element of the four MTJ elements are programmed to store a first logic state and wherein the third MTJ element of the four MTJ elements and the fourth MTJ element of the four MTJ elements are programmed to store a second logic state.

21. The method of claim 20, wherein the first logic state and the second logic state are distinct.

22. The method of claim 13, wherein activating the reference cell of the first memory array via the four word lines is performed by a processor integrated into an electronic device.

23. An apparatus comprising:
   means for storing data; and
   means for providing a resistance value that is coupled to the means for storing data,
   wherein the means for providing the resistance value comprises:
   a first magnetic tunnel junction (MTJ) element connected in parallel with a second MTJ element, wherein the first MTJ element is connected in series between a first transistor and a common node, wherein the second MTJ element is connected in series between a second transistor and the common node; and a third MTJ element connected in parallel with a fourth MTJ element, wherein a third transistor is connected in series between the common node and the third MTJ element, wherein a fourth transistor is connected in series between the common node and the fourth MTJ element, wherein each of the four MTJ elements is coupled to a distinct word line, and wherein each of the four transistors is configured to enable read access to the corresponding MTJ element.

24. The apparatus of claim 23, wherein the means for storing data and the means for providing the resistance value are integrated into one of a set top box, a music player, a video player, an entertainment unit, a navigation device, a communications device, a personal digital assistant (PDA), a fixed location data unit, or a computer.

25. A non-transitory computer readable storage device storing instructions that are executable by a processor to perform operations comprising:
 activating a reference cell of a first memory array via four word lines, the reference cell including:
  a first magnetic tunnel junction (MTJ) element connected in parallel with a
  second MTJ element, wherein the first MTJ element is connected in series between a first transistor and a common node, wherein the second MTJ element is connected in series between a second transistor and the common node; and
  a third MTJ element connected in parallel with a fourth MTJ element, wherein a third transistor is connected in series between the common node and the third MTJ element, wherein a fourth transistor is connected in series between the common node and the fourth MTJ element; and
 generating a reference current through a first bit line coupled to the reference cell, wherein the four MTJ elements are coupled to the first bit line.

26. The non-transitory computer readable storage device of claim 25, wherein the instructions are executable by a processor integrated into one of a set top box, a music player, a video player, an entertainment unit, a navigation device, a communications device, a personal digital assistant (PDA), a fixed location data unit, or a computer.

27. A method comprising:
 a first step for activating a reference cell of a first memory array via four word lines, the reference cell including:
  a first magnetic tunnel junction (MTJ) element connected in parallel with a second MTJ element, wherein the first MTJ element is connected in series between a first transistor and a common node, wherein the second MTJ element is connected in series between a second transistor and the common node; and
  a third MTJ element connected in parallel with a fourth MTJ element, wherein a third transistor is connected in series between the common node and the third MTJ element, wherein a fourth transistor is connected in series between the common node and the fourth MTJ element; and
 a second step for generating a reference current through a first bit line coupled to the reference cell, wherein the four MTJ elements are coupled to the first bit line.

28. The method of claim 27, wherein the first step and the second step are performed by a processor integrated into an electronic device.

29. A method comprising:
 receiving, at a computer configured to process design information, the design information comprising physical positioning information of a packaged semiconductor device on a circuit board, the packaged semiconductor device comprising:
  a group of data cells; and
  a reference cell coupled to the group of data cells,
  wherein the reference cell comprises:
   a first magnetic tunnel junction (MTJ) element connected in parallel with a second MTJ element, wherein the first MTJ element is connected in series between a first transistor and a common node, wherein the second MTJ element is connected in series between a second transistor and the common node; and
   a third MTJ element connected in parallel with a fourth MTJ element, wherein a third transistor is connected in series between the common node and the third MTJ element, wherein a fourth transistor is connected in series between the common node and the fourth MTJ element,
  wherein each of the four MTJ elements is coupled to a distinct word line,
  and wherein each of the four transistors is configured to enable read access to the corresponding MTJ element; and
 transforming, at the computer, the design information to generate a data file.

30. The method of claim 29, wherein the data file has a GERBER format.

31. The method of claim 29, wherein the data file includes a GDSII format.

* * * * *